United States Patent [19]

Inoue

[11] 4,348,609
[45] Sep. 7, 1982

[54] PIEZOELECTRIC VIBRATOR WITH SPURIOUS MODE SUPPRESSION

[75] Inventor: Jiro Inoue, Kanazawa, Japan

[73] Assignee: Murata Manufacturing Co., Ltd., Japan

[21] Appl. No.: 140,848

[22] Filed: Apr. 16, 1980

[30] Foreign Application Priority Data

Apr. 20, 1979 [JP] Japan .................................. 54-49280
Apr. 20, 1979 [JP] Japan .................................. 54-49281
Apr. 20, 1979 [JP] Japan .................................. 54-49282

[51] Int. Cl.³ .......................................... H01L 41/08
[52] U.S. Cl. ..................................... 310/367; 310/366
[58] Field of Search ............... 310/360, 361, 367, 368, 310/311, 358, 359

[56] References Cited

U.S. PATENT DOCUMENTS

| | | | |
|---|---|---|---|
| 2,064,288 | 12/1936 | Bokovoy | 310/368 X |
| 2,073,046 | 3/1937 | Baldwin | 310/368 X |
| 2,254,866 | 9/1941 | Baldwin | 310/368 X |
| 2,925,502 | 2/1960 | Franx | 310/367 |
| 3,213,207 | 10/1965 | Munk | 310/358 X |
| 3,421,109 | 1/1969 | Wiggins et al. | 310/367 X |
| 3,717,778 | 2/1973 | Nagata et al. | 310/358 |

FOREIGN PATENT DOCUMENTS

52-53688  4/1977  Japan .................................. 310/368

Primary Examiner—Mark O. Budd
Attorney, Agent, or Firm—Ostrolenk, Faber, Gerb & Soffen

[57] ABSTRACT

A piezoelectric plate is formed in a configuration defined by four sides, each pair of two adjacent sides defining an angle of each corner. In the case where the piezoelectric plate is configured as a rectangle or a parallelogram, two opposite sides have the same longer length, while the remaining opposite two sides have the same shorter length. For the purpose of suppressing a spurious vibration, the side ratio of the shorter side to the longer side is selected to be 0.7 to 0.98 in the range where no influence is exerted upon a vibration of the fundamental wave. In the case where the piezoelectric plate is configured as a parallelogram or a rhombus, it follows that two opposite angles out of the four angles are the same obtuse angle, while the remaining two opposite angles are the same acute angle. For the purpose of suppressing a spurious vibration, the above described acute angle is selected to be 75° to 89° in the range where no influence is exerted upon a vibration of the fundamental wave.

7 Claims, 23 Drawing Figures

VIBRATION DISPLACEMENT DISTRIBUTION

SURFACE CHARGE DISTRIBUTION

SURFACE CHARGE DISTRIBUTION

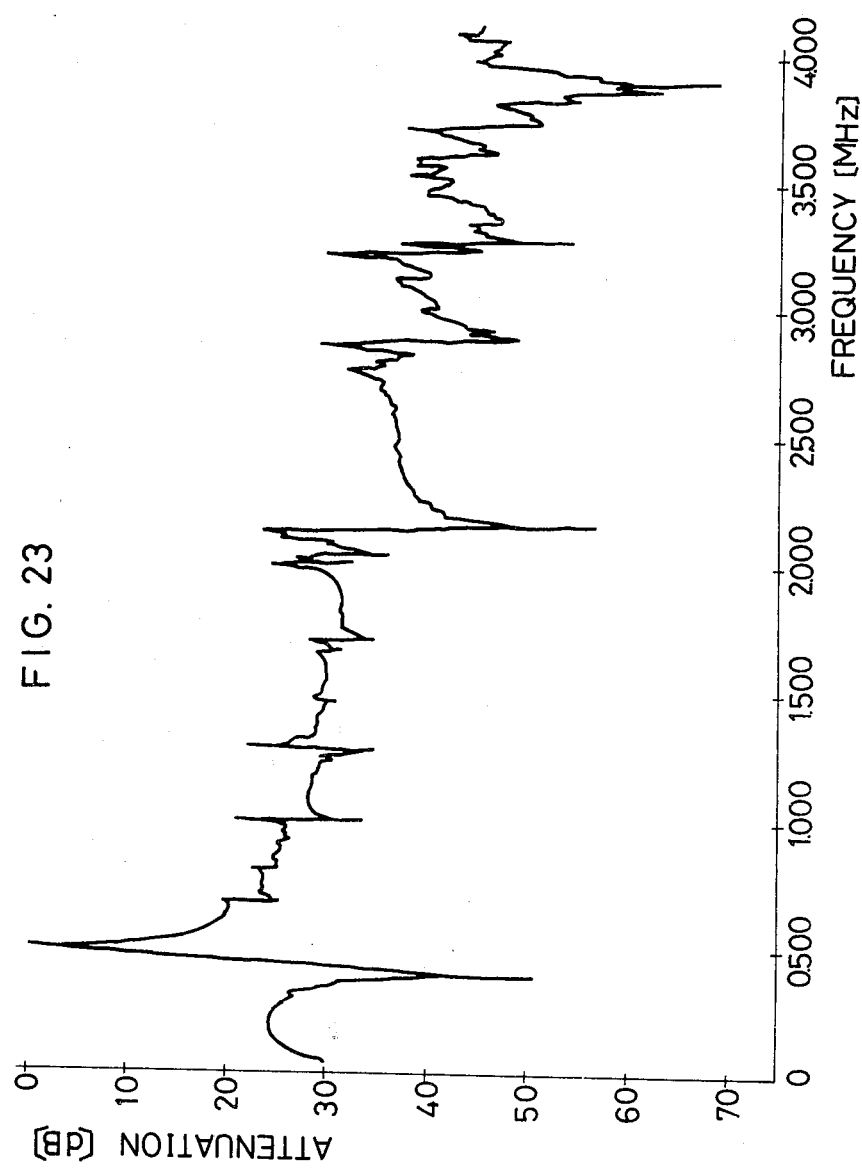

PIEZOELECTRIC VIBRATOR WITH SPURIOUS MODE SUPPRESSION

BACKGROUND OF THE INVENTION

1. Field of the Invention

The present invention relates to a piezoelectric vibrator. More specifically, the present invention relates to a piezoelectric vibrator utilizing an expansion mode vibration or a breath mode vibration.

2. Description of the Prior Art

FIGS. 1 to 3 are views showing different examples of a square plate type vibrator utilizing a conventional expansion mode vibration in which the present invention can be advantageously employed. Such a piezoelectric vibrator 1 comprises a piezoelectric plate 11 of such as PZT, an electrode 12 formed on one main surface thereof, and an electrode 13 formed on the other main surface thereof. The vibrator shown in FIG. 2 is an example wherein the electrode 14 formed on the other main surface of the piezoelectric plate 11 is formed as a partial electrode i.e. an electrode formed only on a portion of the surface of the plate. The example shown in FIG. 3 is a so-called three-terminal type vibrator wherein the electrode 15 formed on the other main surface of the piezoelectric plate 11 is formed as a dot electrode and the electrode 16 formed on the same other main surface of the piezoelectric plate 11 is formed as a ring electrode. Since the principle of an operation of these piezoelectric vibrators is well-known to those skilled in the art, a more detailed description thereof will be omitted.

FIG. 4 is a graph showing a frequency characteristic of the FIG. 3 vibrator used in an intermediate frequency circuit of an AM band radio receiver, for example, as an example of a square plate type piezoelectric vibrator utilizing a conventional expansion mode vibration. As seen from the graph, the conventional example exhibits a large spurious vibration such as the third harmonic or the fifth harmonic of the fundamental vibration frequency. This spurious is a problem. For example, the third harmonic occurs as shown in FIG. 5. More specifically, such harmonic occurs, because a standing wave of the frequency three times the fundamental vibration frequency is superposed in the expansion direction of the piezoelectric plate 11. Therefore, as an approach for suppressing such spurious vibrations, an improvement for precluding such a standing wave by providing the electrode as partial electrodes 12a and 13a, as shown in FIG. 6, has been known. More specifically, by using the partial electrodes 12a and 13a, as shown in FIG. 6, the surface electric charge at the hatched portion in the surface electric charge distribution in FIG. 6 is canceled, whereby the vibration of the third harmonic is suppressed. By properly changing the geometry of the partial electrodes, the fifth harmonic and seventh harmonic or the edge mode vibration spurious vibration or the like can be suppressed. However, this approach merely suppresses only one intended spurious vibration (such as only the third harmonic) and cannot suppress several various spurious vibrations at the same time. Furthermore, in view of other requirements in the characteristic, it could happen that an electrode arrangement cannot be determined in consideration of only such spurious suppression.

SUMMARY OF THE INVENTION

For the purpose of eliminating the above described problems and shortcomings, the present invention employs a piezoelectric plate having a configuration defined by four sides, so that each pair of two adjacent sides defines a corner angle, wherein the dimensions thereof are selected to suppress a spurious vibration.

According to the present invention, spurious vibrations in the third harmonic and the fifth harmonic and other modes such as a edge mode vibration and a bending mode vibration can be fully removed, without any effect upon the fundamental wave, by properly selecting the geometry of the piezoelectric plate.

In a preferred embodiment of the present invention, the piezoelectric plate is configured in a rhombus, wherein the lengths of the four sides are selected to be the same and two opposite angles are equal obtuse angles while the remaining two opposite angles are equal acute angles. The above described two opposite acute angles are selected to be 75° to 89°. Accordingly, in fabricating a piezoelectric vibrator, a piezoelectric plate of a configuration of a rhombus can be readily obtained by only changing the corner angles from the right angle of a conventional piezoelectric plate of a configuration of a square having four sides of the same length and four corner angles of the same right angle to the above described obtuse and acute angles, with a slight change of the existing facilities for fabricating conventional piezoelectric plates having a configuration of a square. Since it is not necessary to change the sides of the piezoelectric plate and it is sufficient to change only the configuration, a packaging case for covering the inventive piezoelectric vibrator may be the same as that for a conventional piezoelectric vibrator of a piezoelectric plate having a square configuration. In this connection, it has been observed that the lengths of the sides of the inventive piezoelectric plate need not be necessarily selected to be the same length and alternatively a piezoelectric plate may be configured as a parallelogram having the two opposite longer sides and the two opposite shorter sides. In such a case, by selecting the side ratio of the shorter side length to the longer side length to be 0.7 to 0.98, a spurious vibration can be effectively suppressed without any effect upon a vibration of the fundamental wave. Furthermore, it has been observed that the inventive piezoelectric vibrator may be configured as a rectangle by selecting the four corner angles defined by the two adjacent longer and shorter sides of the above described parallelogram piezoelectric plate to be the same.

Accordingly, a principal object of the present invention is to provide an improved piezoelectric vibrator which is capable of fully suppressing a spurious vibration without any effect upon a vibration of the fundamental wave.

Another object of the present invention is to provide a piezoelectric vibrator having a configuration of a piezoelectric plate selected to the optimum geometry for fully removing a spurious vibration.

A further object of the present invention is to provide a piezoelectric vibrator capable of fully suppressing a spurious vibration without an influence being exerted upon a vibration of the fundamental wave that can be fabricated using the existing facilities for fabricating conventional piezoelectric vibrators having a configuration of a square, only with a slight modification.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 23 is a graph showing a frequency characteristic in the case where the embodiment shown in FIG. 20 is employed in an intermediate frequency circuit of an AM band radio receiver.

DESCRIPTION OF THE PREFERRED EMBODIMENTS

Figure 1:
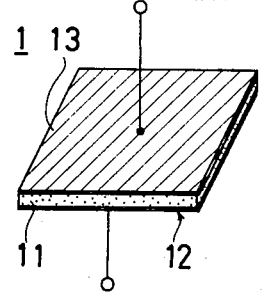
FIGS. 1 to 3 are view showing different examples of a square plate type piezoelectric vibrator utilizing a conventional expansion mode vibration wherein the present invention can be advantageously employed.
Figure 2:
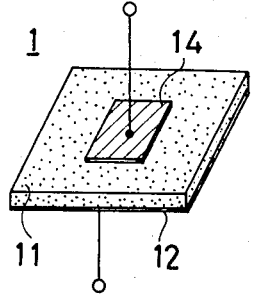
Figure 3:
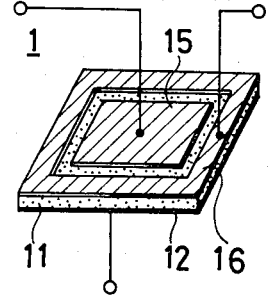
Figure 5:
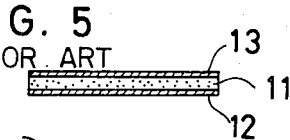
FIG. 5 is a view for explaining generation of the third harmonic.
Figure 6:
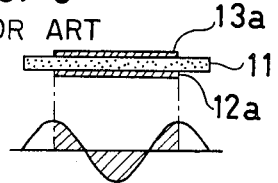
FIG. 6 is a graph showing one example of an electrode structure for suppressing the third harmonic.
Figure 7:
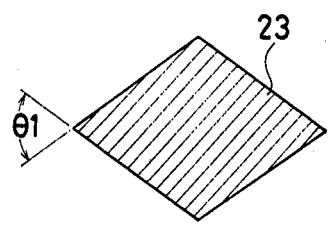
FIGS. 7 to 9 are plan views showing different examples of the first embodiment of the present invention.
Figure 8:
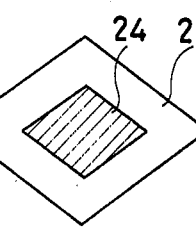
Figure 9:
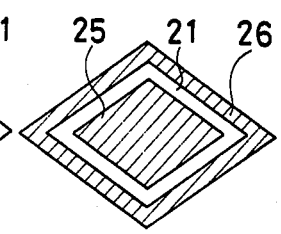

FIGS. 7 to 9 are plan views showing different examples of the first embodiment of the present invention, wherein various configurations of the piezoelectric plate are shown. FIGS. 7, 8 and 9 correspond to FIGS. 1, 2 and 3, respectively. According to the first embodiment, the main surface of the piezoelectric plate is of a configuration of a rhombus rather than a conventional configuration of a square. The angle $\theta 1$ of one corner between two sides of the rhombus is selected to be 75° to 89°.

Figure 10:
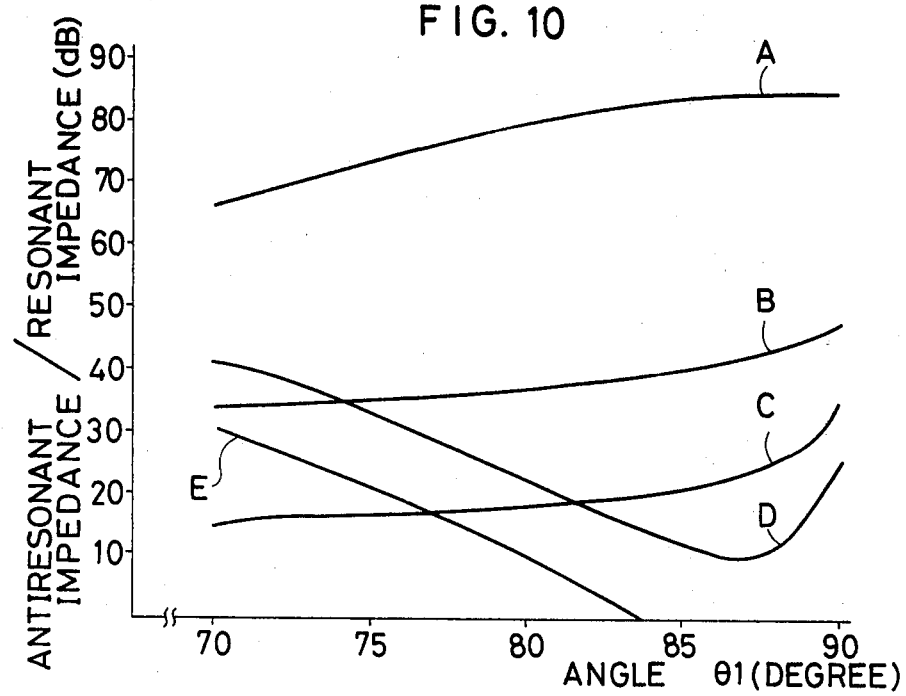
FIG. 10 is a graph showing a characteristic of an antiresonant impedance/resonant impedance with respect to the angle $\theta 1$ of the piezoelectric vibrators shown in FIG. 7.

FIG. 10 is a graph showing the characteristic of an antiresonant impedance/resonant impedance with respect to the angle, wherein the abscissa indicates the angle ($\theta 1$) and the ordinate indicates the ratio (dB) of the antiresonant impedance/resonant impedance. Referring to FIG. 10, the curve A shows the frequency of the fundamental vibration, say 455 kHz, the curve B shows the third harmonic, say 1.2 MHz, the curve C shows the fifth harmonic, say 2.0 MHz, the curve D shows the edge mode vibration, say 650 kHz, and the curve E shows the bending mode vibration, say 300 kHz. As seen from FIG. 10, by forming the piezoelectric plate in a configuration of a rhombus and by selecting the angle $\theta 1$ between the two sides of the rhombus to be approximately 75° to 89°, almost all spurious vibration can be effectively suppressed.

Figure 4:
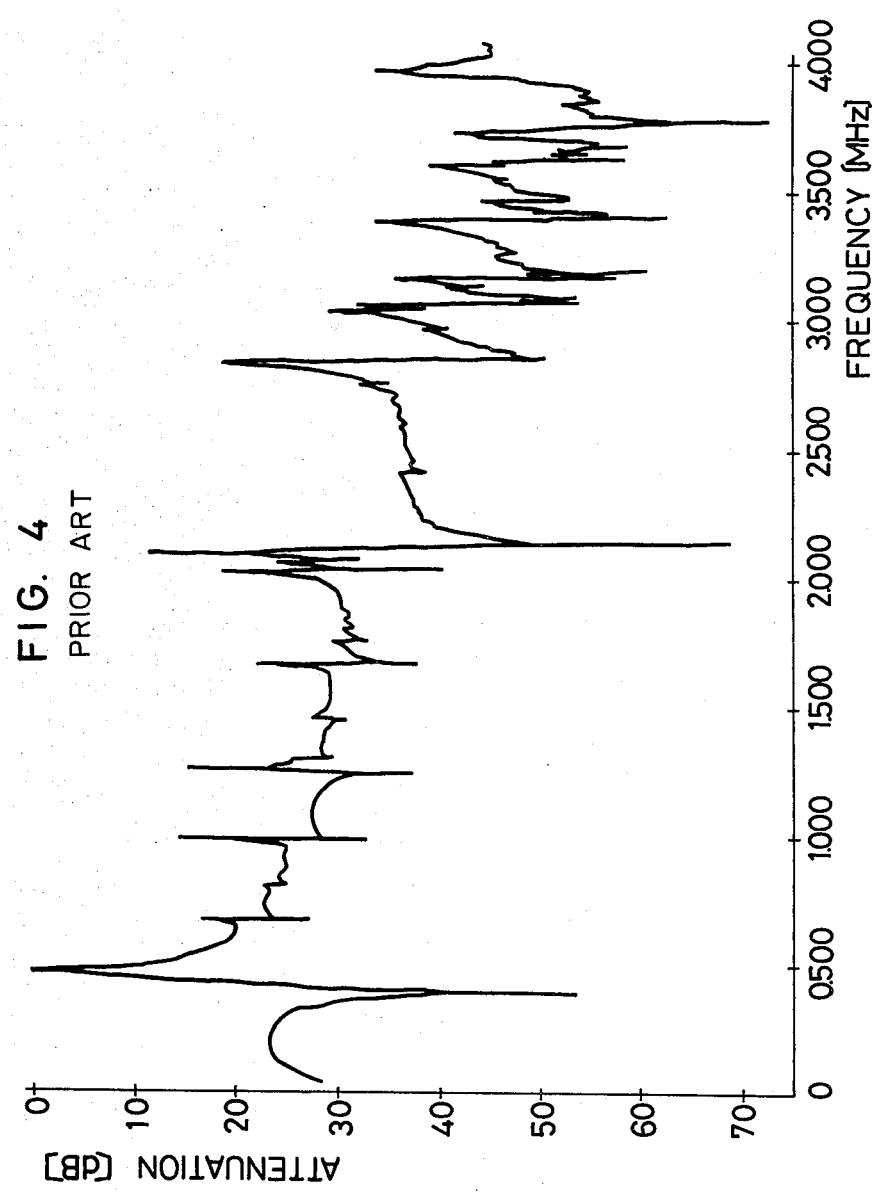
FIG. 4 is a graph showing one example of a frequency characteristic in the case where the three-terminal piezoelectric vibrator shown in FIG. 3 is utilized in an intermediate frequency circuit of an AM band radio receiver.
Figure 11:
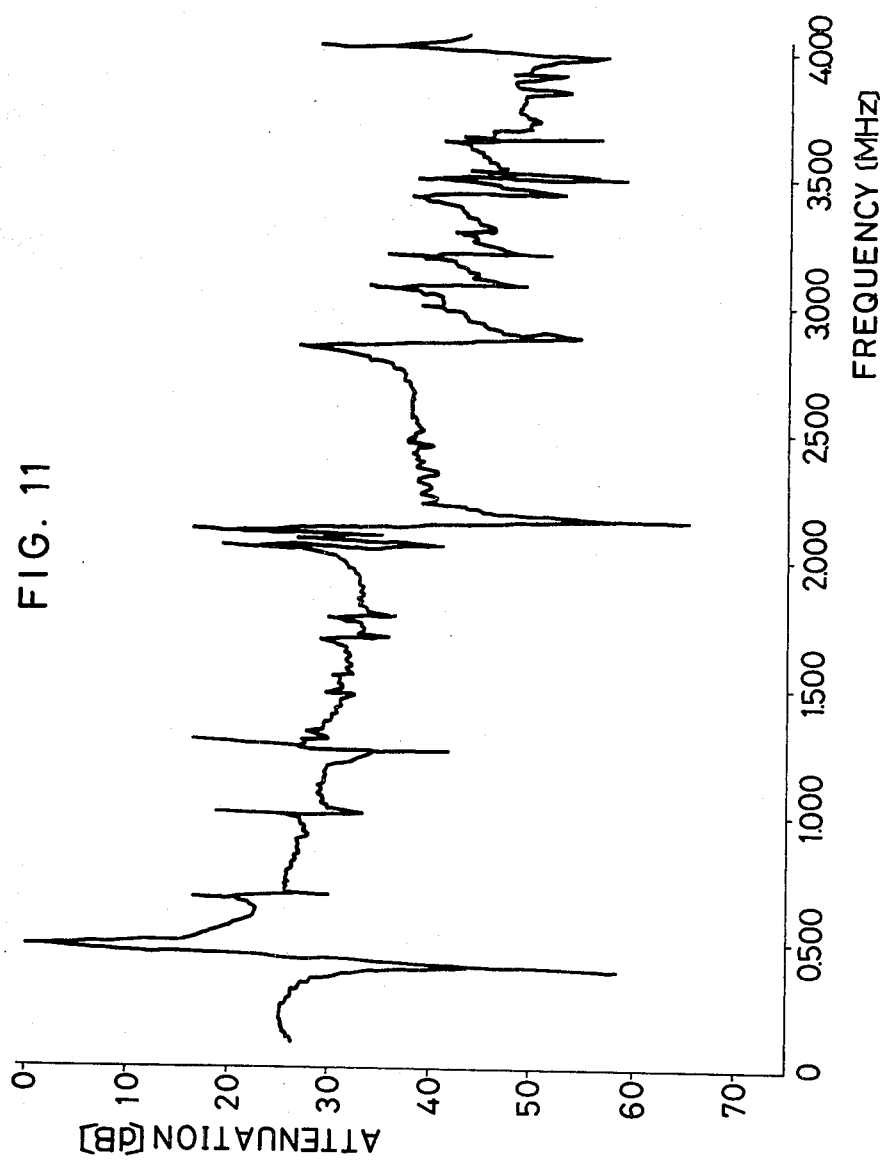
FIG. 11 is a graph showing a frequency characteristic in the case where the FIG. 9 embodiment is used in an intermediate frequency circuit of an AM band radio receiver.

FIG. 11 is a graph showing the frequency characteristic in the case where the FIG. 9 three-terminal piezoelectric vibrator is used in an intermediate frequency circuit of an AM band radio receiver, wherein the angle $\theta 1$ is selected to be 87.5°, for example. As seen from FIG. 11, it would be appreciated that any and all of the harmonics can be effectively suppressed as compared with the conventional example (FIG. 4). The same applies to the edge mode vibration (FIG. 10) and the similar effect for suppressing the spurious vibration is performed, whatever electrode structure (for example FIG. 7, 8 or 9) is employed.

As seen also from FIG. 10, although an effect for suppressing the spurious vibration is also attained in the case where the angle $\theta 1$ is smaller than 75°, too small an angle $\theta 1$ decreases workability and makes complicated a structure for assembling in a casing, while giving rise to a resonance splitting phenomenon. In consideration of these, the angle $\theta 1$ was selected to be 75° to 89° in the first embodiment.

Figure 12:
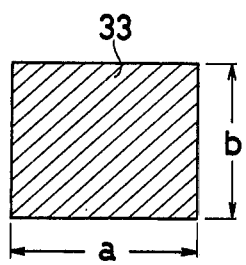
FIGS. 12 to 14 are plan views showing different examples of the second embodiment of the present invention.
Figure 13:
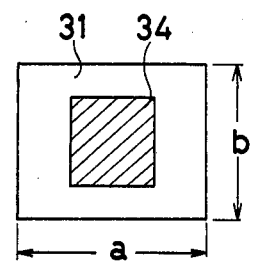
Figure 14:
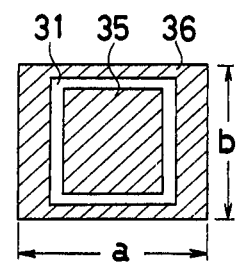

FIGS. 12, 13 and 14 are plan views of different examples of the second embodiment of the present invention, wherein various configurations of the piezoelectric plate is shown. FIGS. 12, 13 and 14 correspond to FIGS. 1, 2 and 3, respectively. The second embodiment has employed a configuration of the main surface of the piezoelectric plate in the form of a rectangle rather than a conventional configuration of a square. The side ratio b/a of the length a of the longer side and the length b of the shorter side of the rectangle is selected to be 0.7 to 0.98.

Figure 15:
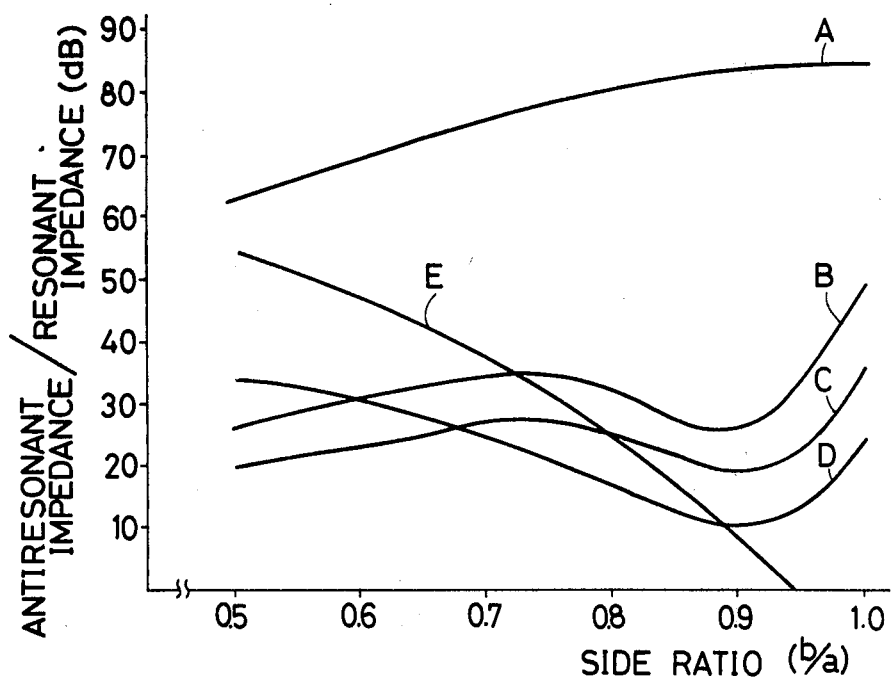
FIG. 15 is a graph showing a characteristic of an antiresonant impedance/resonant impedance with respect to the side ratio b/a of the piezoelectric vibrator shown in FIG. 12.

FIG. 15 is a graph showing the characteristic of an antiresonant impedance/resonant impedance with respect to the side ratio b/a, wherein the abscissa indicates the side ratio b/a and the ordinate indicates the ratio (dB) of the antiresonant impedance/resonant impedance. Referring to FIG. 15, the curve A shows the frequency of a fundamental vibration, say 455 kHz, the curve B shows the third harmonic, say 1.2 MHz, the curve C shows the fifth harmonic, say 2.0 MHz, the curve D shows the edge mode vibration, say 650 kHz, and the curve E shows a bending mode vibration, say 300 kHz. As seen from FIG. 15, it would be appreciated that almost all spurious vibration can be effectively suppressed by selecting the side ratio b/a to be approximately 0.7 to 0.98.

Figure 16:
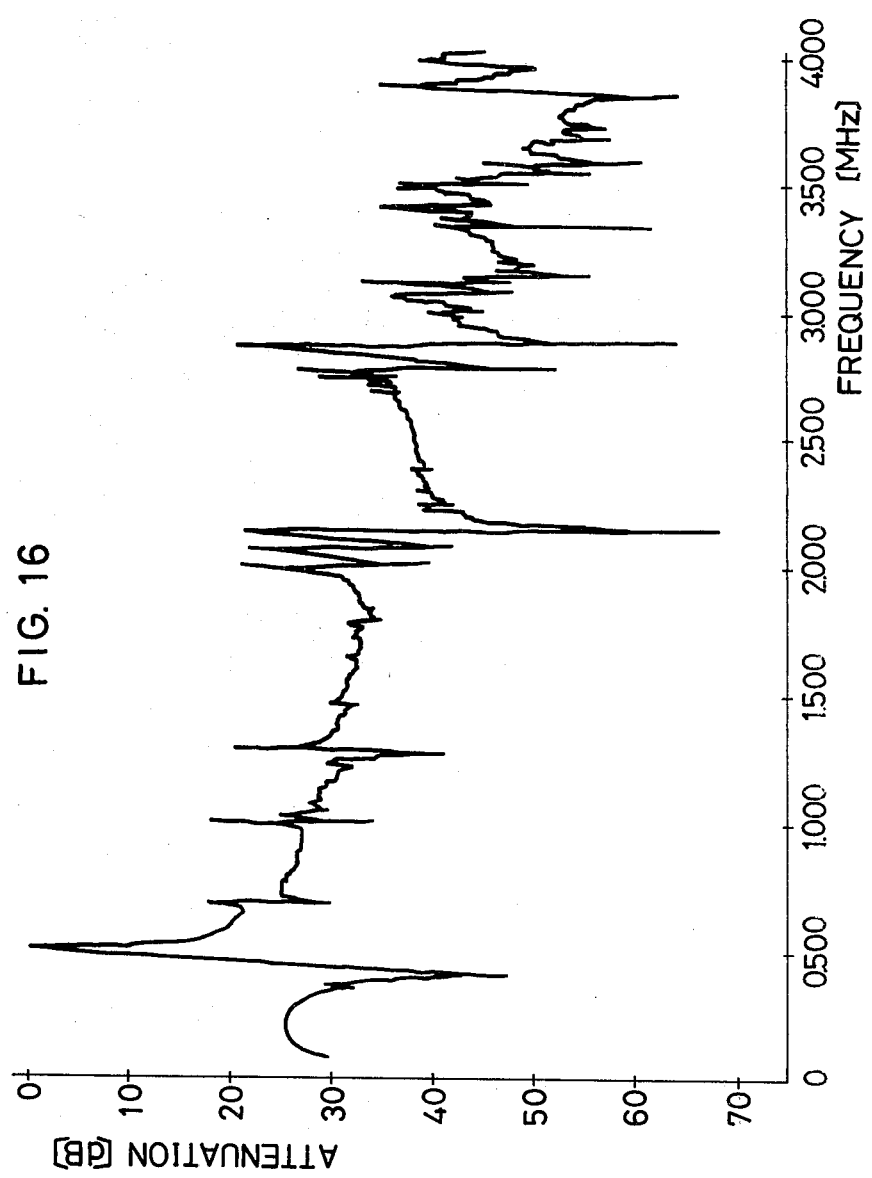
FIG. 16 is a graph showing a frequency characteristic in the case where the FIG. 14 embodiment is used in an intermediate frequency circuit of an AM band radio receiver.

FIG. 16 is a graph showing the frequency characteristic in the case where the FIG. 14 three-terminal piezoelectric vibrator is used in an intermediate frequency circuit of an AM band radio receiver, wherein the side ratio b/a has been selected to be 0.98, for example. As seen from FIG. 16, it would be appreciated that all the harmonics can be effectively suppressed by the embodiment shown, as compared with the conventional example (FIG. 4). The same applies also to the edge mode vibration (FIG. 15) and a similar effect for suppressing the spurious vibration is also attained, whatever electrode configuration (such as FIG. 12, 13 or 14) is employed.

As seen from FIG. 15, although an effect for suppressing the spurious vibration is performed even when the side ratio b/a is decreased to be smaller than 0.7, too small an a side ratio b/a reduces the workability and makes complicated a structure for assembling the same in a casing, while giving rise to a resonance splitting phenomenon. In consideration of these, the side ratio b/a of the second embodiment was selected to be 0.7 to 0.98.

FIGS. 17 to 20 are plan views of several examples of the third embodiment of the present invention, wherein various configurations of the piezoelectric plate are shown. FIGS. 17, 18 and 19, 20 correspond to FIGS. 1, 2 and 3, respectively. The embodiment shown employs a configuration of the main surface of the piezoelectric plate in the form of parallelogram rather than a conventional configuration of a square. The side ratio d/c of the long side c and the short side d of the parallelogram is selected to be 0.7 to 0.98. The angle θ2 between the two sides of the parallelogram is selected to be 75° to 89°.

Figure 21:
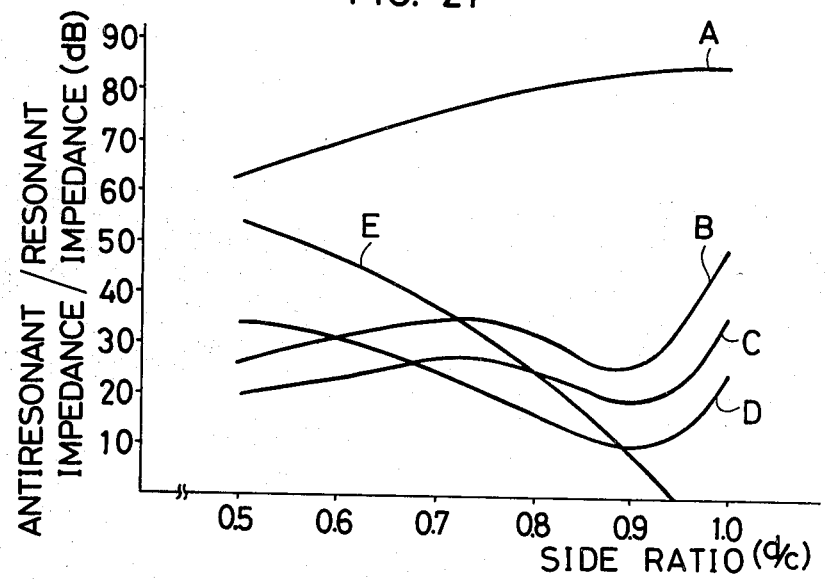
FIG. 21 is a graph showing a characteristic of an antiresonant impedance/resonant impedance with respect to the side ratio d/c of the piezoelectric vibrators shown in FIG. 17.

FIG. 21 is a graph showing the characteristic of an antiresonant impedance/resonant impedance with respect to the side ratio d/c, wherein the abscissa indicates the side ratio d/c and the ordinate indicates the ratio (dB) of the antiresonant impedance/resonant impedance. Referring to FIG. 21, the curve A shows a frequency of the fundamental vibration, say 455 kHz, the curve B shows the third harmonic, say 1.2 MHz, the curve C shows the fifth harmonic, say 2.0 MHz, the curve D shows the edge mode vibration, say 650 kHz, and the curve E shows the bending mode vibration, say 300 kHz.

Figure 17:
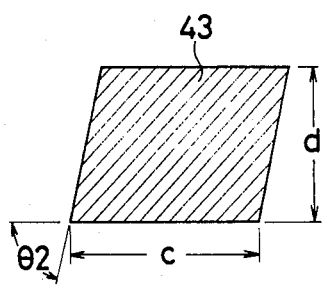
FIGS. 17 to 20 are plan views showing different examples of the third embodiment of the present invention.
Figure 18:
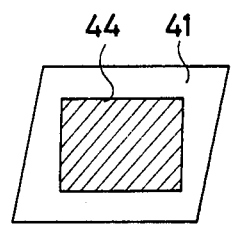
Figure 22:
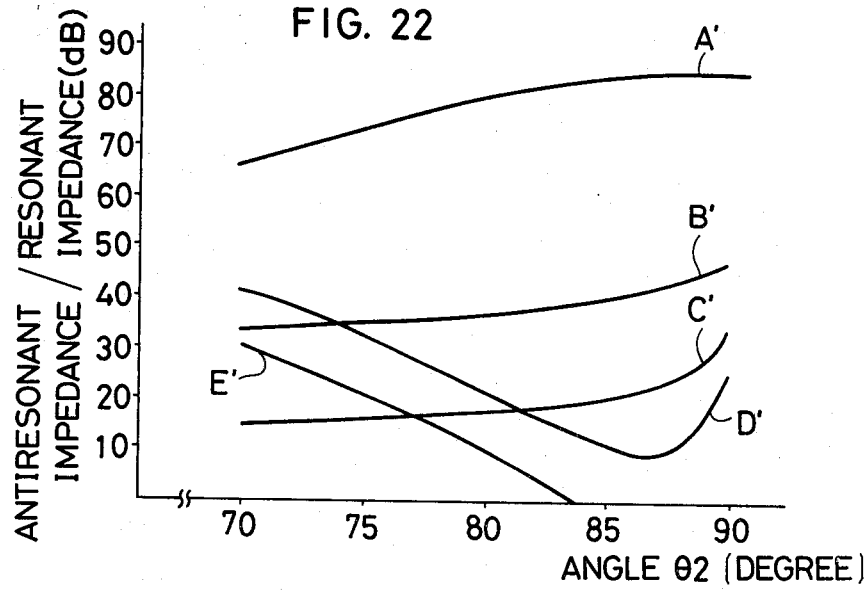
FIG. 22 is a graph showing a characteristic of an antiresonant impedance/resonant impedance with respect to the angle $\theta 2$ of the piezoelectric vibrator shown in FIG. 17.

FIG. 22 is a graph showing the characteristic of an antiresonant impedance/resonant impedance with respect to the angle θ2 in FIG. 17, wherein the abscissa indicates the angle θ2 and the ordinate indicates the ratio (dB) of the resonant impedance and the antiresonant impedance. Referring to FIG. 22, the curve A' shows the frequency of the fundamental vibration, say 455 kHz, the curve B' shows the third harmonic, say 1.2 MHz, the curve C' shows the fifth harmonic, say 2.0 MHz, the curve D' shows the edge mode vibration, say 650 kHz, and the curve E' shows the bending mode vibration, say 300 kHz.

As seen from FIGS. 21 and 22, almost all spurious vibration can be effectively suppressed by forming a configuration of the major surface of the piezoelectric plate in a form of a parallelogram and by selecting the side ratio d/c of the longer side c and the shorter side d of the parallelogram to be 0.7 to 0.98, and by selecting the angle θ2 between the longer side and the shorter side to be 75° to 89°.

Figure 19:
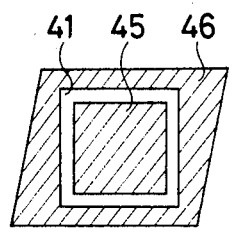
Figure 20:
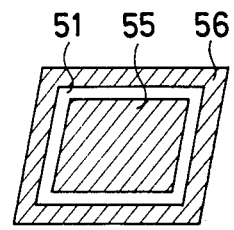

FIG. 23 is a graph showing the frequency characteristic in the case where the three-terminal piezoelectric vibrator shown in FIGS. 19 and 20 is used in an intermediate frequency circuit of an AM band radio receiver, wherein the side ratio d/c is selected to be say 0.96 and the angle θ2 is selected to be say 87.5°. As seen from FIG. 23, it would be appreciated that all of the harmonics can be effectively suppressed according to the embodiment shown, as compared with the conventional example (FIG. 4). The same applies to the edge mode vibration (FIGS. 21 and 22), and a similar effect for suppressing the spurious vibration is performed, whatever electrode structure (such as FIG. 17, 18, 19 or 20) is employed.

As seen from FIGS. 21 and 22, although an effect for suppressing the spurious vibration can be achieved even when the side ratio d/c is smaller than 0.7 and the angle θ2 is smaller than 75°, too small a side ratio d/c reduces the workability and makes complicated a structure for assembling the same in a casing, while giving rise to a resonance splitting phenomenon. In consideration of these, the side ratio d/c was selected to be 0.7 to 0.98 and the angle θ2 was selected to be 75° to 89°.

Meanwhile, the present invention can be utilized in a resonator, three-terminal filter, a ladder type filter and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An expansion mode piezoelectric vibrator, comprising:
   a ceramic piezoelectric plate having first and second opposed major surfaces;
   first electrode means disposed on said first major surface;
   second electrode means disposed on said second major surface, the position and geometry of said first and second electrode means causing said piezoelectric vibrator to vibrate primarily in an expansion mode; and
   said ceramic piezoelectric plate having the shape of a quadrilateral, the four corner angles of said quadrilateral having values which cause said corner angles to cooperate to suppress at least one predetermined spurious mode of vibration of said vibrator, said at least one spurious mode of vibration being at least one of an edge mode and a bending mode vibration, at least one said corner angle being an acute angle.

2. An expansion mode piezoelectric vibrator in accordance with claim 1, in which said quadrilateral is a parallelogram.

3. A piezoelectric vibrator in accordance with claim 2, wherein two opposite said sides of said parallelogram have a first length and the remaining two opposite said sides of said parallelogram have a second length shorter than said first length; and the ratio of said second length to said first length being within an optimum range of ratios for suppressing said at least one spurious mode of vibration.

4. A piezoelectric vibrator in accordance with claim 3, 1 or 2, wherein two opposite angles of said four corner angles are selected to be equal obtuse angles and the remaining two opposite angles are selected to be equal acute angles, and wherein the value of said acute angles lies within an optimum range of angle values for suppressing said at least one spurious mode of vibration.

5. A piezoelectric vibrator in accordance with claim 4, wherein said optimum range of angle values 75° to 89°.

6. A piezoelectric vibrator in accordance with claim 5, wherein said piezoelectric plate is configured as a rhombus.

7. A piezoelectric vibrator in accordance with claim 3, wherein said second optimum range of ratios is 0.7 to 0.98.

* * * * *